(12) United States Patent
Chow et al.

(10) Patent No.: US 8,138,590 B2
(45) Date of Patent: Mar. 20, 2012

(54) INTEGRATED CIRCUIT PACKAGE SYSTEM WITH WIRE-IN-FILM ENCAPSULATION

(75) Inventors: Seng Guan Chow, Singapore (SG); Rui Huang, Singapore (SG); Heap Hoe Kuan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 12/143,047

(22) Filed: Jun. 20, 2008

(65) Prior Publication Data
US 2009/0315164 A1    Dec. 24, 2009

(51) Int. Cl.
*H01L 23/49* (2006.01)
*H01L 21/56* (2006.01)

(52) U.S. Cl. ............ 257/680; 257/686; 257/E21.502; 257/E23.024; 257/678; 438/118

(58) Field of Classification Search .......... 257/678, 257/686, 690, 713, 734, 777, 778, E21.502, 257/E23.024; 438/106, 108, 109, 112, 118, 438/123, 124, 127
See application file for complete search history.

(56) References Cited

U.S. PATENT DOCUMENTS

| | | | |
|---|---|---|---|
| 5,106,784 A | 4/1992 | Bednarz | |
| 5,326,243 A | 7/1994 | Fierkens | |
| 5,438,216 A * | 8/1995 | Juskey et al. | 257/434 |
| 5,869,883 A | 2/1999 | Mehringer et al. | |
| 7,253,078 B1 * | 8/2007 | Nguyen et al. | 438/411 |
| 7,364,945 B2 | 4/2008 | Shim et al. | |
| 2005/0090050 A1 * | 4/2005 | Shim et al. | 438/200 |
| 2006/0275952 A1 | 12/2006 | Gowda et al. | |
| 2007/0181990 A1 * | 8/2007 | Huang et al. | 257/686 |
| 2008/0131998 A1 * | 6/2008 | Takiar et al. | 438/109 |
| 2010/0027233 A1 | 2/2010 | Low et al. | |

* cited by examiner

*Primary Examiner* — Victor A Mandala
*Assistant Examiner* — Whitney T Moore
(74) *Attorney, Agent, or Firm* — Mikio Ishimaru (57) ABSTRACT

An integrated circuit package system includes: connecting a carrier and an integrated circuit mounted thereover; preforming a wire-in-film encapsulation having a cavity; pressing the wire-in-film encapsulation over the carrier and the integrated circuit with the cavity exposing a portion of the integrated circuit; and curing the wire-in-film encapsulation.

20 Claims, 5 Drawing Sheets

INTEGRATED CIRCUIT PACKAGE SYSTEM WITH WIRE-IN-FILM ENCAPSULATION

TECHNICAL FIELD

The present invention relates generally to an integrated circuit package system and more particularly to a mountable integrated circuit package system with wire-in-film encapsulation.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). POP design using resin encapsulation require special or custom mold chase for forming cavity or recesses in the resin encapsulation. Alternatively, specialized dam structures can be used with planar mold chases to form the cavity or recess in the resin encapsulation. Both processes add steps and complexity to the manufacturing of the package. Even designs that are not POP but requiring a window in the resin encapsulation also struggle with the same challenges as stated.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including connecting a carrier and an integrated circuit mounted thereover; preforming a wire-in-film encapsulation having a cavity; pressing the wire-in-film encapsulation over the carrier and the integrated circuit with the cavity exposing a portion of the integrated circuit; and curing the wire-in-film encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the Referring now to FIG. 1, therein is shown a top view of an integrated circuit package system 100 in a first embodiment of the present invention. The top view depicts a wire-in-film encapsulation 102, such as a penetrable film adhesive or wire-in-film, having a cavity 104. As a further example, the wire-in-film encapsulation 102 can be a B-stage penetrable material that can be preformed by printing, laminating, or coating. The cavity 104 exposes an integrated circuit 106, such as an integrated circuit die, having bond pads 108.

Figure 1:
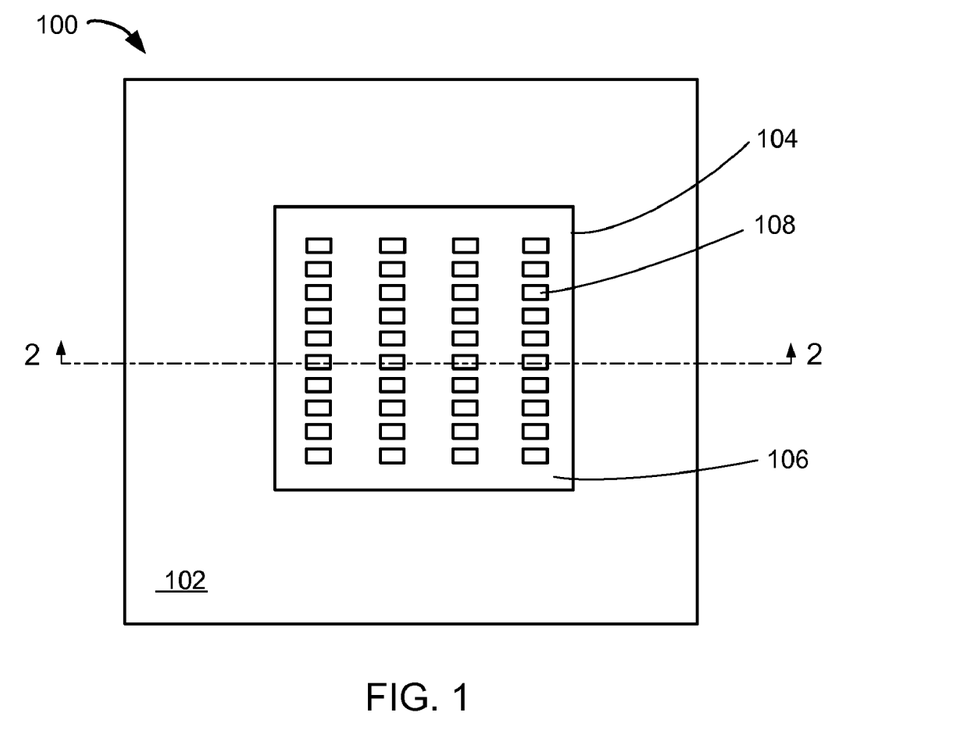
FIG. 1 is a top view of an integrated circuit package system in a first embodiment of the present invention.
Figure 2:
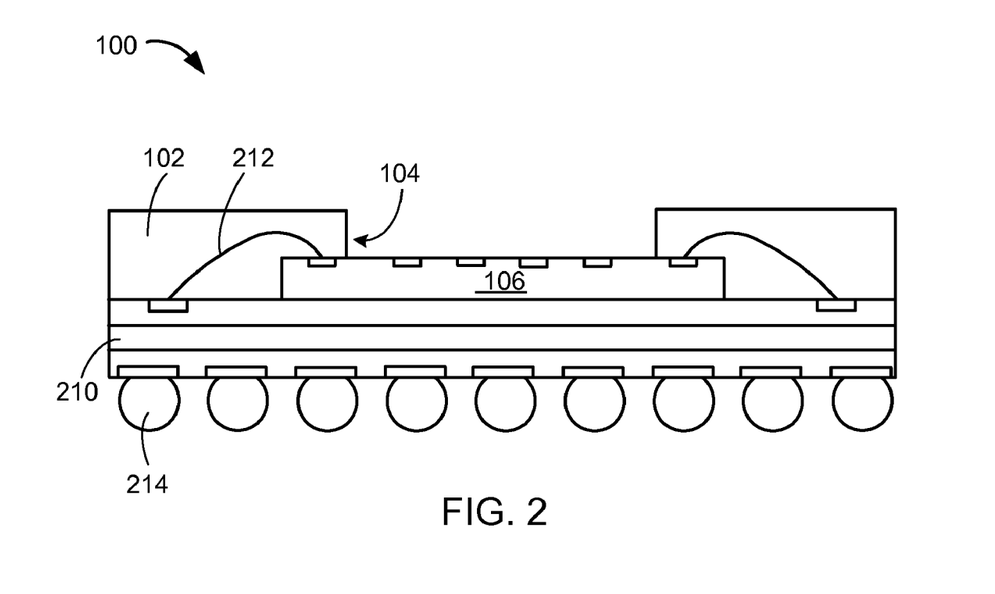
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The integrated circuit 106 can be over a carrier 210, such as a laminated substrate. For illustrative purposes, the integrated circuit package system 100 is shown with the integrated circuit 106 as an integrated circuit die, although it is understood that the integrated circuit package system 100 can have a different type of the integrated circuit 106. For example, the integrated circuit 106 can represent an inverted inter-stacking module (ISM), a flip chip with through silicon via (TSV), or stacked interposer on a pre-molded package.

Electrical interconnects 212, such as bond wires or ribbon bond wires, can connect the integrated circuit 106 and the carrier 210. The wire-in-film encapsulation 102 can be over the carrier 210 covering the electrical interconnects 212. The wire-in-film encapsulation 102 includes the cavity 104 such that the wire-in-film encapsulation 102 partially exposes the integrated circuit 106 in the cavity 104. The cavity 104 includes orthogonal sidewalls that are vertically perpendicular to the exposed side of the integrated circuit 106. External interconnects 214, such as solder balls, can connect below and to the carrier 210.

It has been discovered that the present invention provides an integrated circuit package system with improved reliability, lower manufacturing equipment cost, improved yield, and lower overall cost. The wire-in-film encapsulation eliminates special or custom mold chase required to manufacture the cavity in the encapsulation. The elimination of the special mold chase also eliminates the risk of integrated circuit damage by the protrusion from the mold chase to form the cavity. The wire-in-film encapsulation eliminates the need for separate dam structures that can be used with planar mold chase thereby simplifying the complexity of the package design. The wire-in-film encapsulation can reduce or eliminate the wire sweep.

Figure 3:
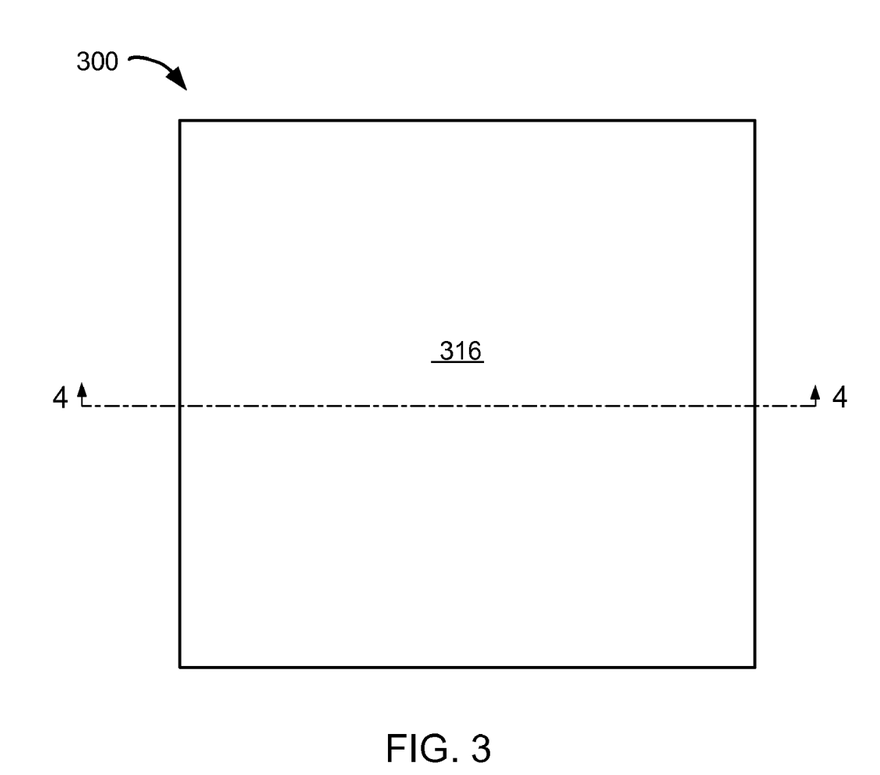
FIG. 3 is a top view of an integrated circuit package system in a second embodiment of the present invention.

Referring now to FIG. 3, therein is shown a top view of an integrated circuit package system 300 in a second embodiment of the present invention. The top view depicts a lid 316, such as a glass lid. For illustrative purposes, the integrated circuit package system 300 is shown having a square geometric configuration, although it is understood that the integrated circuit package system 300 can have a different geometric configuration. For example, the integrated circuit package system 300 can have a rectangular configuration.

Figure 4:
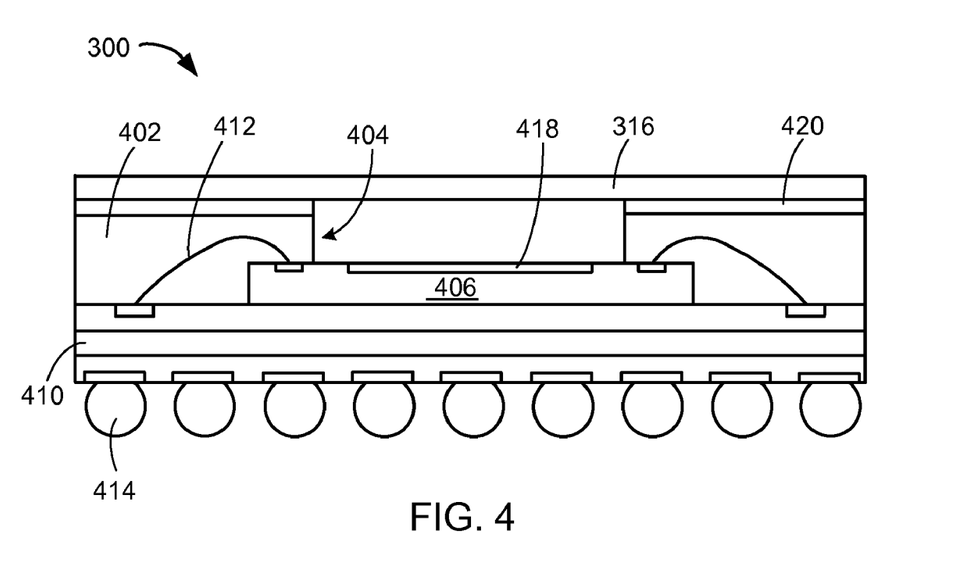
FIG. 4 is a cross-sectional view of the integrated circuit package system along line 4-4 of FIG. 3.

Referring now to FIG. 4, therein is shown a cross-sectional view of the integrated circuit package system 300 along line 4-4 of FIG. 3. An integrated circuit 406, such as an integrated circuit die, can be over a carrier 410, such as a laminated substrate. Electrical interconnects 412, such as bond wires or ribbon bond wires, can connect the integrated circuit 406 and the carrier 410.

A wire-in-film encapsulation 402, such as a penetrable film adhesive with B-stage characteristic, can be over the carrier 410 covering the electrical interconnects 412. The wire-in-film encapsulation 402 includes a cavity 404 such that the wire-in-film encapsulation 402 partially exposes the integrated circuit 406 in the cavity 404. The integrated circuit 406 can also include an optical area 418 that is light sensitive. The optical area 418 can be exposed through the cavity 404.

The lid 316 can be attached to the wire-in-film encapsulation 402 with an adhesive 420. The lid 316 can provide a transparent window for the optical area 418 as well as protected the optical area 418 with the wire-in-film encapsulation 402. External interconnects 414, such as solder balls, can connect below and to the carrier 410.

Figure 5:
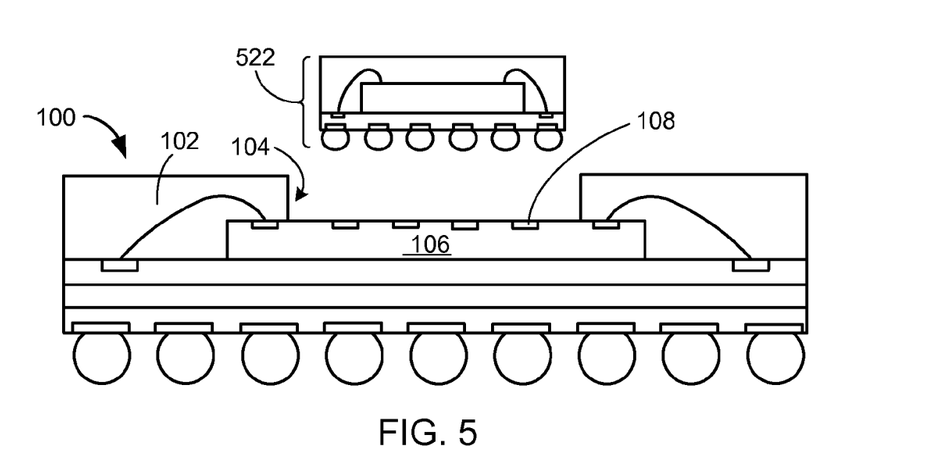
FIG. 5 is a cross-sectional view of an application of the integrated circuit package system of FIG. 2 with a device mounting thereover.

Referring now to FIG. 5, therein is shown a cross-sectional view of an application of the integrated circuit package system 100 of FIG. 2 with a device 522 mounting thereover. The device 522, such as a packaged integrated circuit, can mount over the integrated circuit package system 100. The device 522 can connect to the bond pads 108 of the integrated circuit 106 exposed through the cavity 104 of the wire-in-film encapsulation 102. The device 522 can be pre-tested to ensure a known good device (KGD) without assembly with the integrated circuit package system 100.

Figure 6:
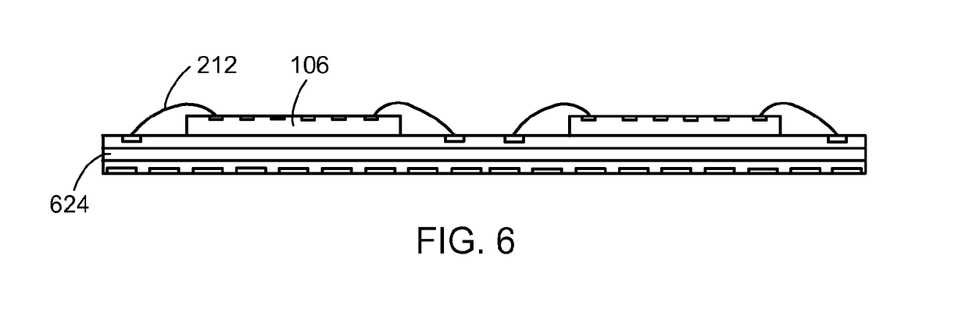
FIG. 6 is a cross-sectional view of the integrated circuit package system of FIG. 2 in connecting the integrated circuit.

Referring now to FIG. 6, therein is shown a cross-sectional view of the integrated circuit package system 100 of FIG. 2 in connecting the integrated circuit 106. The integrated circuit 106, one or more than one, can be mounted over a carrier strip 624, such as a laminated substrate. The electrical interconnects 212 can connect the integrated circuit 106 and the carrier strip 624.

Figure 7:
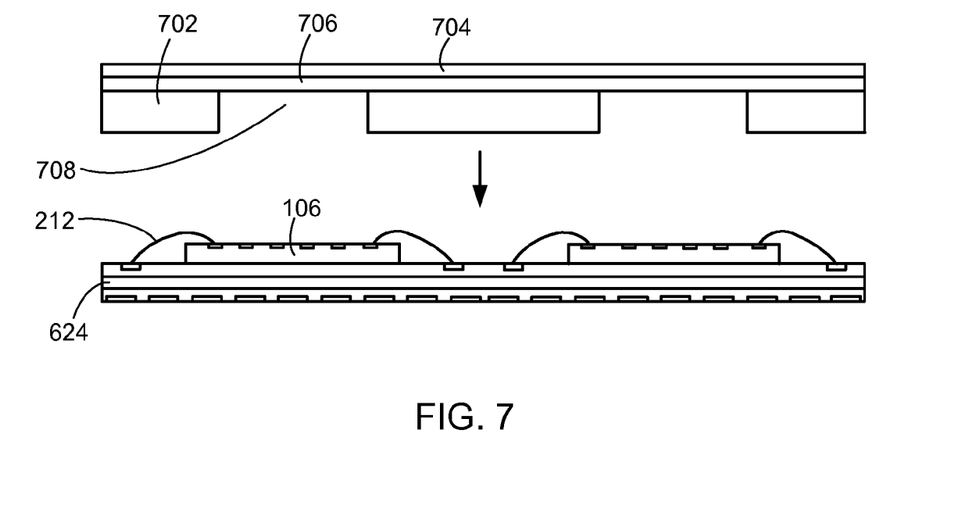
FIG. 7 is the structure of FIG. 6 in applying a film encapsulant.

Referring now to FIG. 7, therein is shown the structure of FIG. 6 in applying a film encapsulant 702. The film encapsulant 702, such as a penetrable film adhesive with B-stage characteristic, can be preformed and attached to a stiffener 704, such as a mold chase, a metal stiffener, a glass stiffener, or an organic stiffener, with a stiffener adhesive 706.

The film encapsulant 702 having B-stage characteristic can include a viscosity range between 10 to 2000 Pa·s at approximately 100C or at die bonding stage. The film encapsulant 702 includes an elastic modulus before curing (B-stage) should be less than 300 MPa and should be greater than 3000 MPa after curing. There is preferably a difference of about 10× before and after curing. The elastic modulus preferably drops as temperature increased before and after curing.

The stiffener 704 with the film encapsulant 702 can be place over the carrier strip 624 with openings 708 in the film encapsulant 702 aligned over the integrated circuit 106. The film encapsulant 702 can be over the electrical interconnects 212. The film encapsulant 702 is preformed with the openings 708 and attached to the stiffener 704. The film encapsulant 702 can be pressed towards to the carrier strip 624 to surround the electrical interconnects 212 and the integrated circuit 106.

Figure 8:
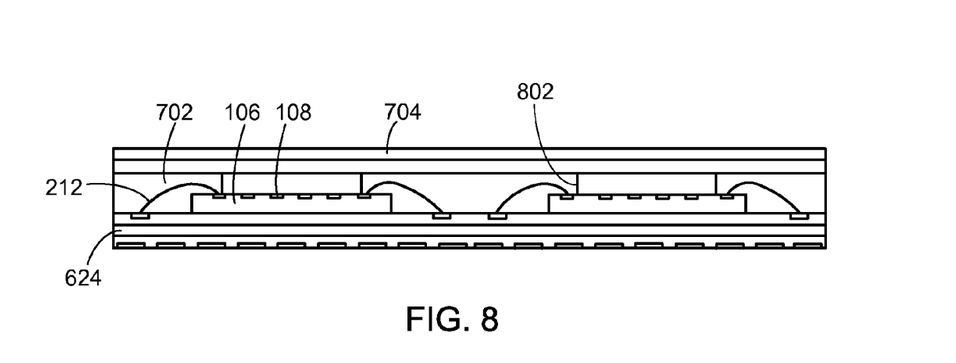
FIG. 8 is the structure of FIG. 7 in hardening the film encapsulant.

Referring now to FIG. 8, therein is shown the structure of FIG. 7 in hardening the film encapsulant 702. The film encapsulant 702 can be mounted over the carrier strip 624, the electrical interconnects 212, and exposing a portion of the bond pads 108 of the integrated circuit 106. The sidewalls of the openings 708 of FIG. 7 can have a characteristic of a intersecting bulge 802, which is an irregular protrusion of the inner sidewalls of the cavity 104 at the intersecting corners of the cavity 104 caused by the pressing of the film encapsulant 702 on the carrier strip 624, the electrical interconnects 212, and the integrated circuit 106. With the film encapsulant 702 attached with the stiffener 704, the film encapsulant 702 can undergo a cure and hardening process.

Figure 9:
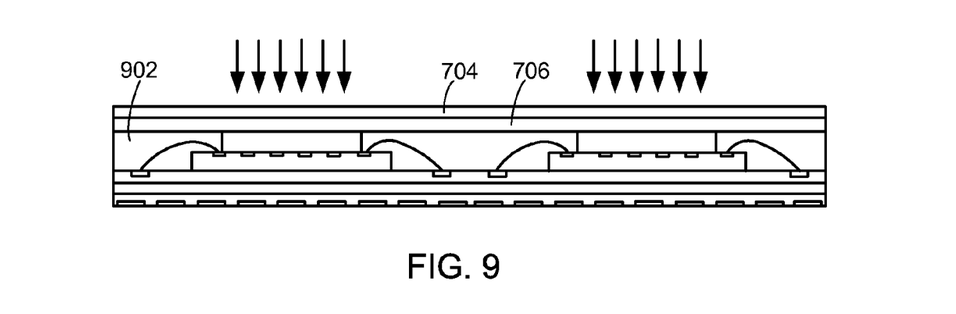
FIG. 9 is the structure of FIG. 8 in forming an intermediate wire-in-film encapsulation.

Referring now to FIG. 9, therein is shown the structure of FIG. 8 in forming an intermediate wire-in-film encapsulation 902. With the stiffener 704 as a glass stiffener, the structure of FIG. 8 can undergo exposure to ultraviolet (UV) light or cure at a higher temperature when a thermal sensitive adhesive is used for the stiffener adhesive 706. The UV or higher temperature cure can form the intermediate wire-in-film encapsulation 902 from the film encapsulant 702 of FIG. 8.

Figure 10:
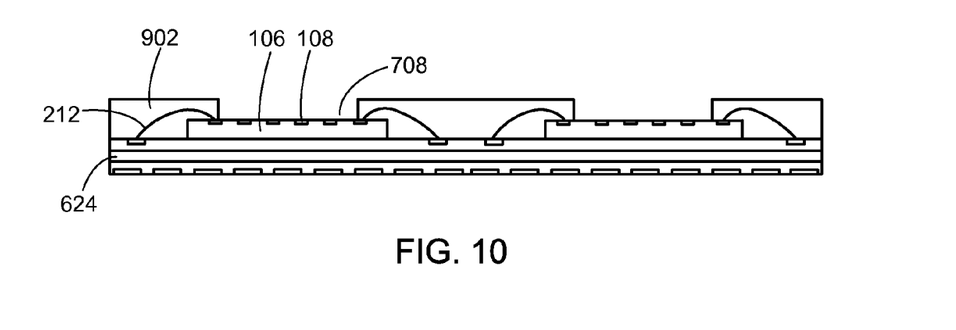
FIG. 10 is the structure of FIG. 9 in exposing the intermediate wire-in-film encapsulation.

Referring now to FIG. 10, therein is shown the structure of FIG. 9 in exposing the intermediate wire-in-film encapsulation 902. The stiffener 704 of FIG. 9 and the stiffener adhesive 706 of FIG. 9 can be removed leaving the intermediate wire-in-film encapsulation 902 over the carrier strip 624 and the electrical interconnects 212. The intermediate wire-in-film encapsulation 902 includes the openings 708 partially exposing the integrated circuit 106. The bond pads 108 can be exposed through the openings 708.

Figure 11:
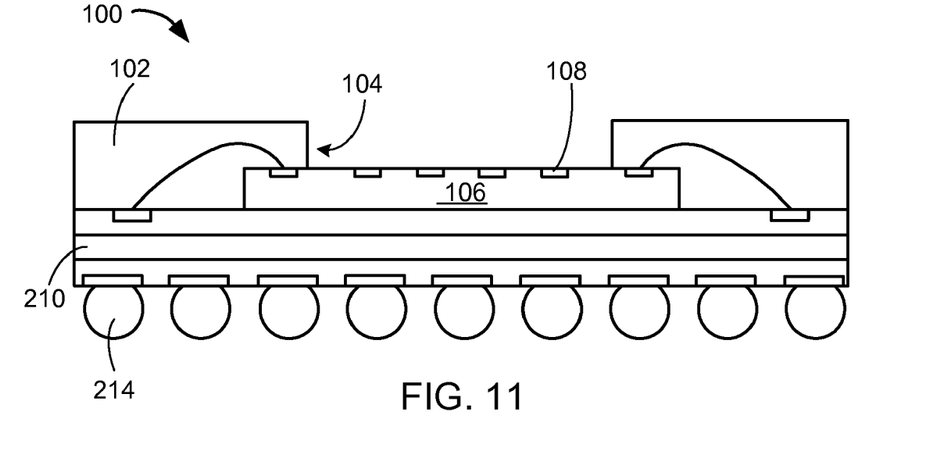
FIG. 11 is the structure of FIG. 10 in a singulating the integrated circuit package system of FIG. 2.

Referring now to FIG. 11, therein is shown the structure of FIG. 10 in a singulating the integrated circuit package system 100 of FIG. 2. The carrier strip 624 of FIG. 10 having the intermediate wire-in-film encapsulation 902 of FIG. 10 over the carrier strip 624 can undergo singulation forming the carrier 210 and the wire-in-film encapsulation 102. The wire-in-film encapsulation 102 includes the cavity 104 exposing the bond pads 108 of the integrated circuit 106. The external interconnects 214 can be attached below and to the carrier 210.

Figure 12:
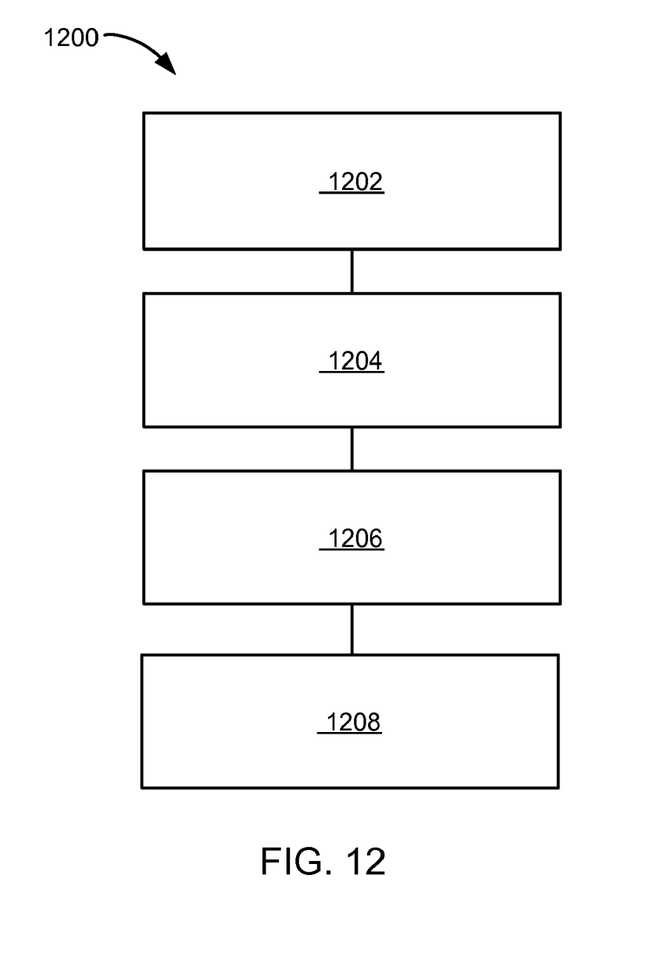
FIG. 12 is a flow chart of an integrated circuit package system for manufacture of the integrated circuit package system in an embodiment of the present invention.

Referring now to FIG. 12, therein is shown a flow chart of an integrated circuit package system 1200 for manufacture of the integrated circuit package system 100 in an embodiment of the present invention. The system 1200 includes connecting a carrier and an integrated circuit mounted thereover in a block 1202; preforming a wire-in-film encapsulation having a cavity in a block 1204; pressing the wire-in-film encapsulation over the carrier and integrated circuit with the cavity exposing a portion of the integrated circuit in a block 1206; and curing the wire-in-film encapsulation in a block 1208.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
    connecting a carrier and an integrated circuit, mounted thereover, by a bond wire;
    preforming a penetrable wire-in-film encapsulation having a cavity with orthogonal sidewalls;
    pressing the penetrable wire-in-film encapsulation over the carrier, the bond wire, and the integrated circuit with the sidewalls of the cavity having a characteristic of an intersecting bulge caused by compression and the cavity exposing a portion of the integrated circuit; and
    curing the penetrable wire-in-film encapsulation.

2. The method as claimed in claim 1 wherein preforming the penetrable wire-in-film encapsulation having the cavity includes attaching the penetrable wire-in-film encapsulation to a stiffener.

3. The method as claimed in claim 1 wherein preforming the penetrable wire-in-film encapsulation having the cavity includes preforming a penetrable film adhesive having a B-stage characteristic.

4. previously presented) The method as claimed in claim 1 further comprising mounting a device over the integrated circuit and in the cavity of the penetrable wire-in-film encapsulation.

5. The method as claimed in claim 1 further comprising attaching a lid over the cavity and the integrated circuit.

6. A method for manufacturing an integrated circuit package system comprising:
    connecting a carrier and an integrated circuit, mounted thereover, by a bond wire;
    preforming a penetrable wire-in-film encapsulation having a cavity with orthogonal sidewalls;
    pressing the penetrable wire-in-film encapsulation over the carrier, the bond wire, and the integrated circuit with the sidewalls of the cavity having a characteristic of an intersecting bulge caused by compression and the cavity exposing a bond pad of the integrated circuit;
    curing the penetrable wire-in-film encapsulation; and
    attaching an external interconnect below the carrier.

7. The method as claimed in claim 6 wherein connecting the carrier and the integrated circuit includes connecting a substrate and an integrated circuit die.

8. The method as claimed in claim 6 wherein connecting the carrier and the integrated circuit includes connecting the carrier and a flip chip.

9. The method as claimed in claim 6 wherein connecting the carrier and the integrated circuit includes connecting the carrier and an inter-stacking module.

10. The method as claimed in claim 6 further comprising attaching a lid over the cavity and an optical area of the integrated circuit.

11. An integrated circuit package system comprising:
    a carrier;
    an integrated circuit over the carrier;
    a bond wire connecting the carrier to the integrated circuit; and
    a preformed penetrable wire-in-film encapsulation having a cavity with sidewalls over the carrier, the bond wire, and the integrated circuit with the sidewalls of the cavity having a characteristic of an intersecting bulge caused by compression and exposing a portion of the integrated circuit.

12. The system as claimed in claim 11 further comprising an electrical interconnect between the integrated circuit and the carrier.

13. The system as claimed in claim 11 wherein the penetrable wire-in-film encapsulation includes a penetrable film adhesive having a B-stage characteristic.

14. The system as claimed in claim 11 further comprising a device over the integrated circuit and in the cavity of the penetrable wire-in-film encapsulation.

15. The system as claimed in claim 11 further comprising attaching a lid over the cavity and the integrated circuit.

16. The system as claimed in claim 11 wherein:
the integrated circuit includes a bond pad;
the penetrable wire-in-film encapsulation exposes the bond pad through the cavity; and
further comprising an external interconnect attached below and to the carrier.

17. The system as claimed in claim 16 wherein:
the carrier includes a substrate; and
the integrated circuit includes an integrated circuit die.

18. The system as claimed in claim 16 wherein the integrated circuit includes a flip chip.

19. The system as claimed in claim 16 wherein the integrated circuit includes an inter-stacking module.

20. The system as claimed in claim 16 further comprising a lid over the cavity and an optical area of the integrated circuit.

\* \* \* \* \*

UNITED STATES PATENT AND TRADEMARK OFFICE
CERTIFICATE OF CORRECTION

PATENT NO. : 8,138,590 B2
APPLICATION NO. : 12/143047
DATED : March 20, 2012
INVENTOR(S) : Chow et al.

It is certified that error appears in the above-identified patent and that said Letters Patent is hereby corrected as shown below:

Column 4:
line 43, delete "between 10 to 2000 Pa·s at" and insert therefor --between 10 to 2000 Pa.s at--

Column 6:
claim 4, line 23, delete "previously presented)" before "The method as claimed in claim 1"

Column 7:
claim 14, line 6, delete "penetrable wire-in-filmencapsulation." and insert therefor --penetrable wire-in-film encapsulation.--

Signed and Sealed this
Fourth Day of December, 2012

David J. Kappos
*Director of the United States Patent and Trademark Office*